United States Patent
Ifuku et al.

(10) Patent No.: US 12,163,898 B2
(45) Date of Patent: Dec. 10, 2024

(54) METHOD AND APPARATUS FOR DETECTING ABNORMAL GROWTH OF GRAPHENE

(71) Applicant: Tokyo Electron Limited, Tokyo (JP)

(72) Inventors: Ryota Ifuku, Yamanashi (JP); Takashi Matsumoto, Yamanashi (JP); Akira Fujio, Yamanashi (JP); Kousaku Saito, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 343 days.

(21) Appl. No.: 17/439,160

(22) PCT Filed: Feb. 26, 2020

(86) PCT No.: PCT/JP2020/007751
§ 371 (c)(1),
(2) Date: Sep. 14, 2021

(87) PCT Pub. No.: WO2020/195485
PCT Pub. Date: Oct. 1, 2020

(65) Prior Publication Data
US 2022/0155242 A1    May 19, 2022

(30) Foreign Application Priority Data
Mar. 25, 2019    (JP) .................. 2019-056007

(51) Int. Cl.
*G01N 21/95*    (2006.01)
*C01B 32/18*    (2017.01)
(Continued)

(52) U.S. Cl.
CPC ......... *G01N 21/9501* (2013.01); *C01B 32/18* (2017.08); *C01B 32/186* (2017.08);
(Continued)

(58) Field of Classification Search
CPC ...................... C01B 32/18; G01N 2021/8822
See application file for complete search history.

(56) References Cited

U.S. PATENT DOCUMENTS 8,294,887 B1 * 10/2012 Biellak .............. G01N 21/9501
356/237.4
2012/0128573 A1 * 5/2012 Yoo .......................... C01B 32/18
977/843
(Continued)

FOREIGN PATENT DOCUMENTS

JP    2010-236968 A    10/2010
JP    2013-100205 A    5/2013
(Continued)

OTHER PUBLICATIONS

Vesel et al. Synthesis of Vertically Oriented Graphene Sheets or Carbon Nanowalls—Review and Challenges. Materials (Basel). Sep. 12, 2019;12(18):2968. doi: 10.3390/ma12182968. PMID: 31547440; PMCID: PMC6766222. (Year: 2019).*
(Continued)

*Primary Examiner* — Tarifur R Chowdhury
*Assistant Examiner* — Kemaya Nguyen
(74) *Attorney, Agent, or Firm* — Venjuris, P.C.

(57) ABSTRACT

A method of detecting an abnormal growth of graphene includes: preparing an inspection target having a graphene
(Continued)

film formed on a substrate by CVD; receiving light from the graphene film by using a dark field optical system; and inspecting the received light, thereby detecting the abnormal growth of the graphene.

8 Claims, 6 Drawing Sheets

(51) Int. Cl.
    *C01B 32/186*     (2017.01)
    *G01N 21/956*     (2006.01)
    *H01L 21/02*     (2006.01)
    *G01N 21/88*     (2006.01)

(52) U.S. Cl.
    CPC ..... *G01N 21/956* (2013.01); *H01L 21/02488* (2013.01); *H01L 21/02491* (2013.01); *H01L 21/02502* (2013.01); *H01L 21/02527* (2013.01); *H01L 21/0262* (2013.01); *C01P 2004/03* (2013.01); *C01P 2004/04* (2013.01); *G01N 2021/8822* (2013.01)

(56) References Cited

U.S. PATENT DOCUMENTS

| | | | |
|---|---|---|---|
| 2015/0023858 A1* | 1/2015 | Tour | B29C 39/003 |
| | | | 423/276 |
| 2015/0240351 A1* | 8/2015 | Chen | H01J 37/32073 |
| | | | 427/532 |
| 2018/0195952 A1* | 7/2018 | Mizutani | G02B 21/0092 |

FOREIGN PATENT DOCUMENTS

| | | |
|---|---|---|
| JP | 2014-231455 A | 12/2014 |
| JP | 2017-116293 A | 6/2017 |

OTHER PUBLICATIONS

International Search Report issued on Apr. 21, 2020 for WO 2020/195485 A1 (6 pages).

Kang, J. H. et al., Strain Relaxation of Graphene Layers by Cu Surface Roughening, Nano Letters, Sep. 14, 2016, vol. 16, pp. 5993-5998.

Wu, X. et al., Nondestructive optical visualization of graphene domains and boundaries, Nanoscale, 2016, vol. 8, pp. 16427-16434.

Ding, D. et al., Grain Boundaries and Gas Barrier Properiy of Graphene Revealed by Dark-Field Optical Microscopy, The Journal of Physical Chemistry C, Dec. 4, 2017, vol. 122, pp. 902-910.

* cited by examiner

METHOD AND APPARATUS FOR DETECTING ABNORMAL GROWTH OF GRAPHENE

CROSS REFERENCE TO RELATED APPLICATIONS

This application is a national phase of PCT application No. PCT/JP2020/007751, filed on 26 Feb. 2020, which claims priority from Japanese Patent Application No. 2019-056007, filed on 25 Mar. 2019, all of which are incorporated herein by reference.

TECHNICAL FIELD

The present disclosure relates to a method and an apparatus for detecting an abnormal growth of graphene.

BACKGROUND

Graphene is a structure in which a graphite thin film of one to about several tens or several hundreds of atomic layers is formed on a substrate, and is a two-dimensional crystal formed in parallel to the substrate.

Graphene is constructed as an aggregate of a six-membered ring structure by covalent bonds ($sp^2$-bonds) of carbon atoms, and has unique electronic properties such as mobility of 200,000 $cm^2$/Vs or more which is 100 times or more that of silicon (Si), and current density of $10^9$ A/$cm^2$ which is 1,000 times or more that of Cu.

Due to the properties, graphene has attracted attention as being useful for various device materials such as wiring, field effect transistor (FET) channels, and barrier films.

As for a method of forming graphene, a method has been proposed which forms a catalyst metal layer on a processing target, performs an activation process of the catalyst metal layer, and then, forms graphene by CVD (Chemical Vapor Deposition). In an embodiment, a CVD using microwave plasma is described as an example (Patent Documents 1 and 2).

When graphene is formed by CVD, the graphene usually grows two-dimensionally. However, it is known that an abnormal growth may occur which is so-called a carbon nanowall (CNW) in which a single-layer graphene (graphene sheet) has components vertical to a substrate over one layer or several layers.

PRIOR ART DOCUMENT

Patent Document

Patent Document 1: Japanese Patent Laid-Open Publication No. 2013-100205
Patent Document 2: Japanese Patent Laid-Open Publication No. 2014-231455

SUMMARY OF THE INVENTION

Problem to be Solved

The present disclosure provides a method and an apparatus for detecting an abnormal growth of a graphene film formed by CVD.

Means to Solve the Problem

According to an aspect of the present disclosure, a method of detecting an abnormal growth of graphene includes: preparing an inspection target having a graphene film formed on a substrate by CVD; receiving light from the graphene film by using a dark field optical system; and inspecting the received light, thereby detecting the abnormal growth of the graphene.

Effect of the Invention

According to the present disclosure, it is possible to detect an abnormal growth of a graphene film formed by CVD.

DETAILED DESCRIPTION TO EXECUTE THE INVENTION

Hereinafter, an embodiment will be described with reference to the accompanying drawings.

First, the background will be described.

When a graphene film is formed by CVD, the graphene usually grows two-dimensionally in parallel to the substrate. However, as described above, abnormal growth so-called a carbon nanowall (CNW) or VGG (vertically grown graphene) having components vertical to a substrate may occur. The CNW (VGG) is an ultrathin film sheet (several nm) similar to graphene, and the amount thereof tends to increase as the film formation time increases.

Figure 1A:
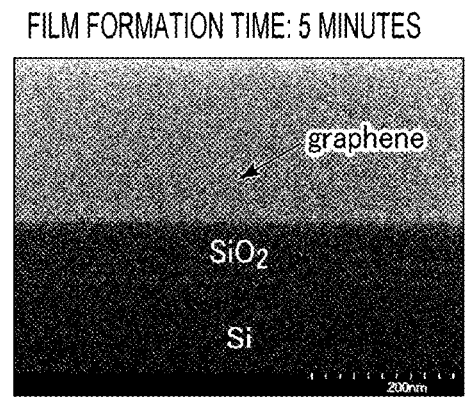
FIG. 1A is an SEM photograph of a graphene film formed by plasma CVD (film formation time: 5 minutes).
Figure 1B:
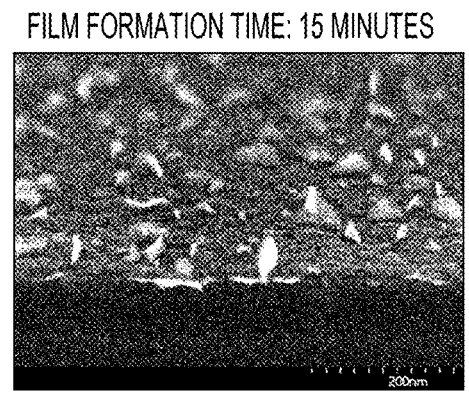
FIG. 1B is an SEM photograph of a graphene film formed by plasma CVD (film formation time: 15 minutes).
Figure 1C:
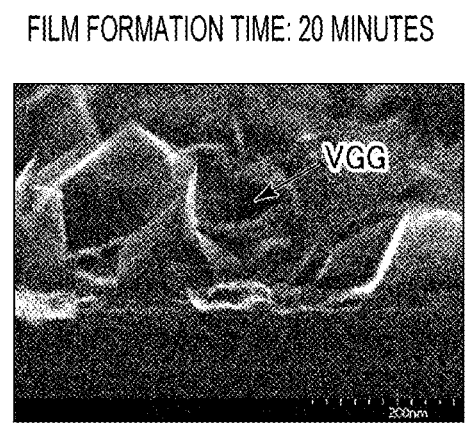
FIG. 1C is an SEM photograph of a graphene film formed by plasma CVD (film formation time: 20 minutes).

FIGS. 1A to 1C are SEM photographs of a graphene film formed by plasma CVD, and represent film formation times of 5 minutes, 15 minutes, and 20 minutes, respectively. From the SEM photographs, it may be found out that there exists only graphene mostly parallel to the substrate when the film formation time is 5 minutes, VGG which is abnormal growth starts to be crystalized when the film formation time is 15 minutes, and the abnormal growth mode is dominant when the film formation time is 20 minutes.

Figure 2A:
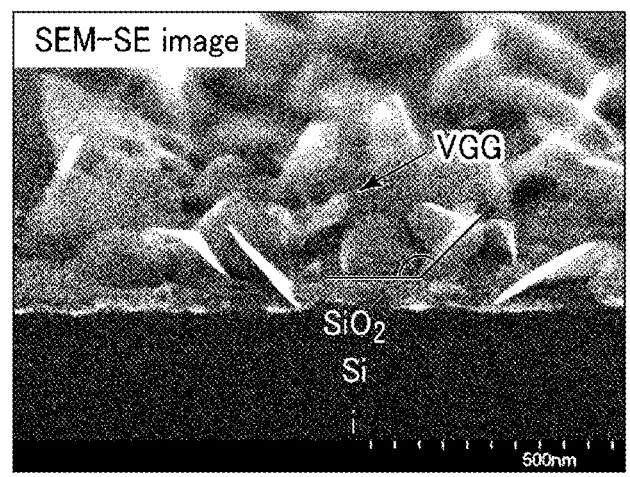
FIG. 2A is an SEM image of a graphene film having VGG.
Figure 2B:
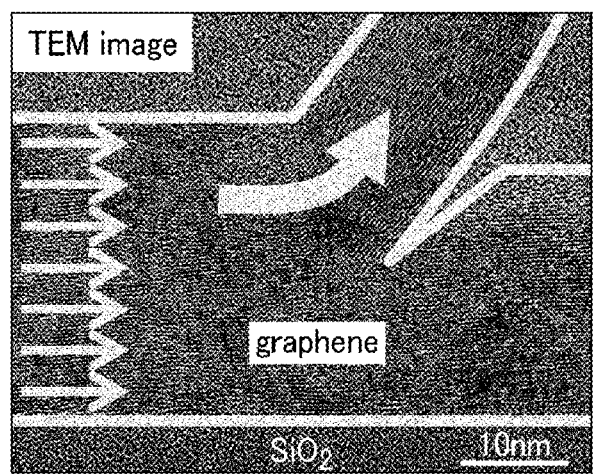
FIG. 2B is a TEM image of a portion where the VGG is crystallized in FIG. 2A.

Further, FIG. 2A is an SEM image of the graphene film having the VGG, and FIG. 2B is a TEM image of the portion where the VGG is crystallized in FIG. 2A. From FIG. 2B, it is understood that the VGG slips out due to, for example, line defects included in graphene crystals. As for one of the causes for the occurrence of abnormal growth, it is presumed that when graphene crystals grow at a plurality of locations in the plane of the substrate, the grown graphene crystal grains collide with each other and run on top of each other.

In consideration of the application of graphene to semiconductors, a technique is necessary which detects the locations where the CNW (VGG) grows as an abnormally grown crystal. However, in view of the formation principle of the graphene film, the CNW (VGG) has the unique shape of a two-dimensional crystal with a thickness of an atomic layer, and no method for detecting the CNW (VGG) has been reported so far.

In the meantime, the present embodiment has demonstrated that the CNW (VGG) is optically detectable by a dark field optical system. The dark field optical system is known as a method of detecting foreign matter on a mirror surface of a semiconductor wafer (e.g., Japanese Patent Laid-Open Publication No. 2011-248216). However, it is the knowledge found out for the first time that the CNW (VGG) is detectable by the dark field optical system.

Hereinafter, detailed descriptions will be made.

Figure 3:
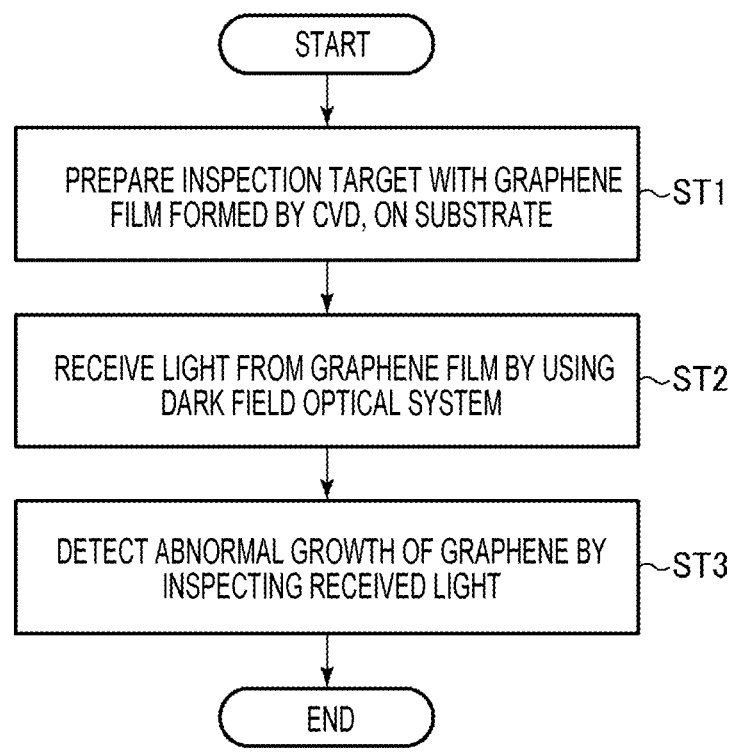
FIG. 3 is a flowchart illustrating a method of detecting abnormal growth of graphene according to an embodiment.

FIG. 3 is a flowchart illustrating a method of detecting abnormal growth of graphene according to an embodiment.

The method according to the embodiment includes steps ST1, ST2, and ST3.

Figure 4:
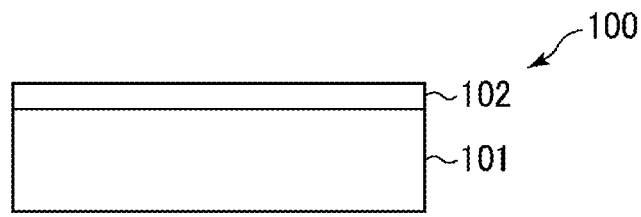
FIG. 4 is a cross-sectional view illustrating an example of an inspection target used in the method of detecting abnormal growth of graphene according to an embodiment.

Step ST1 is a step of preparing an inspection target having a graphene film formed on a substrate by CVD. As illustrated in FIG. 4, an inspection target 100 includes a graphene film 102 formed on an appropriate substrate 100 by CVD. The substrate 101 is not particularly limited, and may be any of a semiconductor, an insulator, and a metal. A catalytic metal layer such as Ni may be formed on the surface of the substrate 101 to promote the growth of graphene.

Figure 5A:
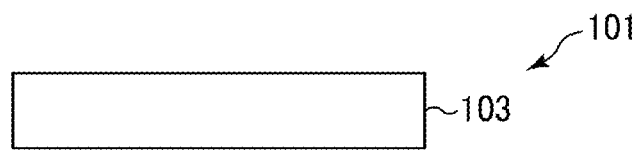
FIG. 5A is a cross-sectional view illustrating an example of a structure of a substrate used as the inspection target.
Figure 5B:
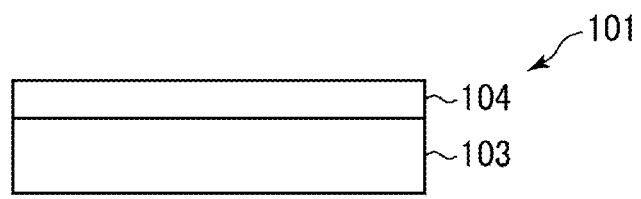
FIG. 5B is a cross-sectional view illustrating another example of the structure of the substrate used as the inspection target.
Figure 5C:
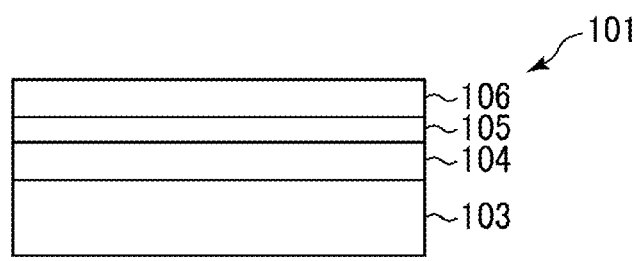
FIG. 5C is a cross-sectional view illustrating yet another example of the structure of the substrate used as the inspection target.

FIGS. 5A to 5C illustrate specific examples of the substrate 101. A typical example of the substrate 101 may be a semiconductor wafer. In the example of FIG. 5A, the substrate 101 is configured by only a semiconductor substrate 103 such as silicon. Further, in the example of FIG. 5B, the substrate 101 has an insulating film 104 such as a $SiO_2$ film formed on the semiconductor substrate 103. In the example of FIG. 5C, the substrate 101 has a metal film 106 such as a Cu film on the semiconductor substrate 103 via the insulating film 104 and a barrier film 105 such as a TaN film, a Ta film, or a TiN film. Depending on the metal, the barrier film 105 may be omitted. Further, the barrier film 105 may be a stacked film (e.g., Ta/TaN).

The method of forming the graphene film 102 may be CVD, or may be thermal CVD or plasma CVD, but from the viewpoint of forming a graphene film with satisfactory crystallinity, plasma CVD is preferable. At this time, the plasma is not particularly limited, but microwave plasma, in particular, remote microwave plasma may be used. The remote microwave plasma refers to plasma in a case where microwaves are introduced into a processing container to generate plasma by a microwave electric field, and the plasma diffused from the plasma generation region acts on a substrate placed away from the plasma generation region. By using the remote microwave plasma, a carbon-containing gas may be dissociated into a state suitable for the growth of graphene at a relatively low temperature.

When the graphene film is formed by CVD, a gas that includes a carbon-containing gas is used as a processing gas. Examples of the carbon-containing gas may include hydrocarbon gases such as ethylene ($C_2H_4$), methane ($CH_4$), ethane ($C_2H_6$), propane ($C_3H_8$), propylene ($C_3H_6$), and acetylene ($C_2H_2$), and alcohol gases such as methanol ($CH_3OH$) and ethanol ($C_2H_5OH$). The gas including a carbon-containing gas may further include a rare gas such as Ar, He, Ne, Kr, or Xe, or may include hydrogen gas ($H_2$ gas) or oxygen gas ($O_2$ gas) in order to improve the crystallinity of graphene.

Step ST2 receives light from the graphene film by using a dark field optical system. The dark field optical system obliquely illuminates the inspection target to suppress regular reflected light from being incident on objective lens, and receives only scattered light or diffracted light generated due to foreign matter present in the inspection target through, for example, the objective lens.

By using the dark field optical system, it is possible to receive only light other than the regular reflected light, that is, the scattered light or the diffracted light, in the graphene film. The scattering of light occurs mainly due to, for example, abnormally grown crystals or particles other than the graphene crystals that are main components, and the location where the scattering of light occurs looks bright.

In step ST3, by using this phenomenon, the received light is inspected so as to detect the abnormal growth of graphene. At this time, the inspection may be conducted by forming an image of the received light to directly observe the image, or by detecting the received light as light intensity.

Figure 6:
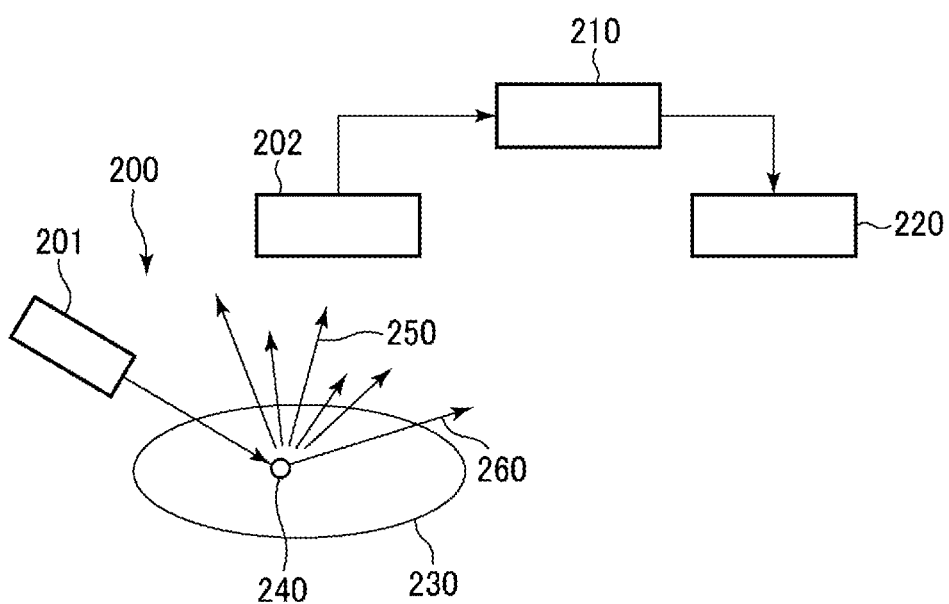
FIG. 6 is a schematic view illustrating an example of an inspection device used in the method of detecting abnormal growth of graphene according to an embodiment.

As the inspection device used for the method of detecting the abnormal growth of graphene according to an embodiment, for example, an inspection device for inspecting defects of a wafer may be used as illustrated in FIG. 6. The inspection device of FIG. 6 includes a dark field optical system 200 that includes a light source 201 and a light receiving system 202, a photodetector 210, and a display 220.

The light source 201 emits illumination light and is not particularly limited, and various light sources such as a laser, an LED, and a light bulb may be used. The light source 201 obliquely irradiates an inspection target 230 having a graphene film on the surface thereof with the illumination light, such that main reflected light 260 on the surface of the inspection target 230 is not incident on the light receiving system 202.

The light receiving system 202 includes, for example, an objective lens and an image forming lens, is provided such that it may be scanned, and receives scattered light 250 from defects. Since an abnormally grown crystal 240 has components vertical to the planar graphene film as described above, the scattering of light occurs, as in the case of defects.

The photodetector 210 detects light using a photoelectric conversion device, and may use a photomultiplier tube (PMT). As a result, the light intensity of a region of, for example, several μmφ may be detected, so that the light intensity increases at a defective portion. The light intensity also increases in the abnormally grown crystal 240, as in the case of defects. By scanning the light receiving system 202, the light intensity of the entire inspection target 230 may be detected.

The display 220 displays data of the light intensity obtained by the photodetector 210. Further, by scanning the light receiving system, the data of the light intensity may be displayed as a map for the entire surface of the inspection target 230. As a result, defects may be detected. The detected defects also include the abnormally grown crystal 240. Thus, by observing the portion where the defects exist in detail using an SEM image or the like, the abnormally grown crystal 240 may be detected.

Figure 7:
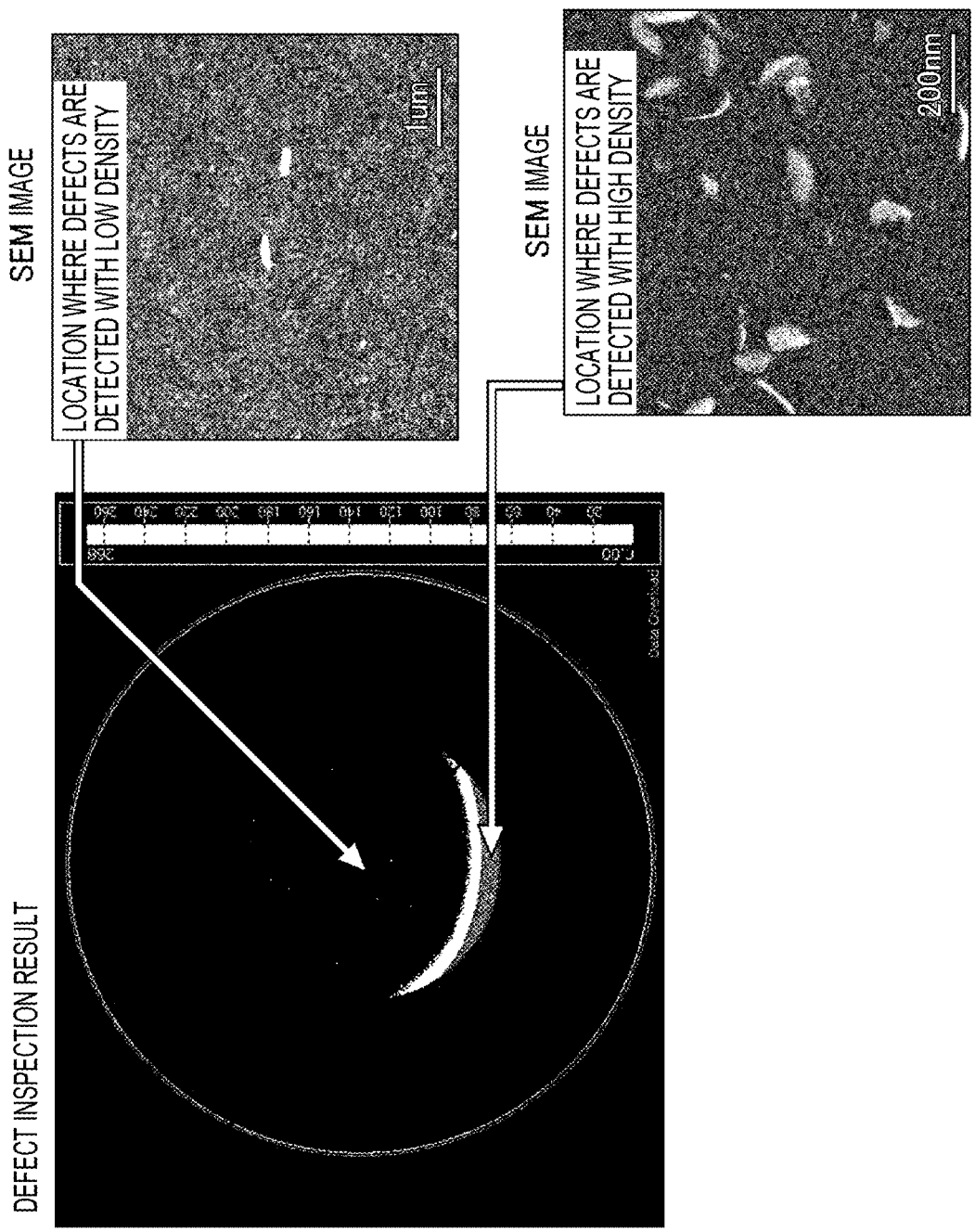
FIG. 7 is a view illustrating a result of the detection of abnormal growth of graphene using a wafer defect inspection device.

FIG. 7 is a view illustrating a result of the detection of the abnormal growth of graphene using a wafer defect inspection device. Here, a Surfscan SP5 manufactured by KLA-Tencor was used as the defect inspection device, and the dark field optical system was used. The measurement light (illumination light) is a laser having a wavelength of 266 nm, and the analysis diameter is several µmφ.

As illustrated in FIG. 7, in the image of the defect inspection result, there are a location where defects are detected with a high density (white or gray), and a location where defects are detected with a low density. From the SEM images of the locations, the abnormal growth of graphene is observed at the locations where the defects are detected. From the result, it is confirmed that the abnormal growth of the graphene film may be detected by using the dark field optical system.

While the embodiment has been described, the embodiment disclosed herein is exemplary and should not be construed as being limited. The embodiment may be omitted, replaced, or modified in various forms without departing from the scope and the gist of the claims attached herein.

For example, while the embodiment describes an example where a wafer defect inspection device is used as a device for detecting the abnormal growth of graphene, the device is not limited thereto and may be any device that uses the dark field optical system.

Further, while the embodiment describes a semiconductor wafer based on a semiconductor such as Si as an example of the substrate used for the inspection target having a graphene film, the present disclosure is not limited thereto.

DESCRIPTION OF SYMBOLS

100, 230: inspection target
101: substrate
102: graphene film
200: dark field optical system
201: light source
202: light receiving system
210: photodetector
220: display
240: abnormally grown crystal
250: scattered light

What is claimed is:

1. A method comprising:
preparing an inspection target having a graphene film formed on a substrate by CVD (Chemical Vapor Deposition), the graphene film including a thin film grown two-dimensionally in parallel to the substrate and an abnormal growth;
receiving light from the graphene film by using a dark field optical system; and
inspecting the received light, thereby detecting the abnormal growth, the abnormal growth including a carbon nanowall grown together with the thin film and having a vertical component extending upwards from the thin film,
wherein the carbon nanowall is formed when graphene crystal grains of the thin film collide with each other while being grown.

2. The method according to claim 1, wherein the dark field optical system includes a light source that obliquely irradiates the graphene film of the inspection target with light, and a light receiving system that receives scattered light from the graphene film.

3. The method according to claim 2, wherein the abnormal growth of the graphene is detected by detecting intensity of the scattered light received by the light receiving system using a photodetector.

4. The method according to claim 3, wherein the photodetector includes a photomultiplier tube.

5. The method according to claim 1, wherein the detecting the abnormal growth of the graphene detects a defect, and detects the abnormal growth from the detected defect.

6. An apparatus comprising:
a dark field optical system including:
a light source configured to irradiate a graphene film formed on a substrate by CVD (Chemical Vapor Deposition) with light; and
a light receiver including a lens configured to receive scattered light, the graphene film including a thin film grown two-dimensionally in parallel to the substrate and an abnormal growth,
a photodetector configured to detect the abnormal growth by detecting a light intensity of the scattered light received by the dark field optical system, the abnormal growth including a carbon nanowall grown together with the thin film and having a vertical component extending upwards from the thin film, the carbon nanowall is formed when graphene crystals grains of the thin film collide with each other while being grown; and
a controller programmed to control the light source, the light receiver and the photodetector,
wherein the controller is programmed to detect the abnormal growth including the carbon nanowall based on a detection result of the photodetector.

7. The apparatus according to claim 6, wherein the light source obliquely irradiates the graphene film with light, and the light receiving system receives the scattered light from the graphene film.

8. The apparatus according to claim 6, wherein the photodetector includes a photomultiplier tube.

* * * * *